(12) United States Patent
Cristian et al.

(10) Patent No.: US 11,314,906 B2
(45) Date of Patent: Apr. 26, 2022

(54) SYSTEM AND METHOD FOR DETECTING DEFECTS IN STRUCTURES SUBJECT TO REPETITIVE STRESS

(71) Applicant: Gulfstream Aerospace Corporation, Savannah, GA (US)

(72) Inventors: Sorin P. Cristian, Savannah, GA (US); Linga Rajagopal Movva, Savannah, GA (US)

(73) Assignee: Gulfstream Aerospace Corporation, Savannah, GA (US)

( * ) Notice: Subject to any disclaimer, the term of this patent is extended or adjusted under 35 U.S.C. 154(b) by 338 days.

(21) Appl. No.: 16/538,250

(22) Filed: Aug. 12, 2019

(65) Prior Publication Data

US 2021/0049247 A1 Feb. 18, 2021

(51) Int. Cl.
*G06F 30/15* (2020.01)
*G06N 20/00* (2019.01)
*G06N 3/08* (2006.01)

(52) U.S. Cl.
CPC .............. *G06F 30/15* (2020.01); *G06N 3/08* (2013.01); *G06N 20/00* (2019.01)

(58) Field of Classification Search
None
See application file for complete search history.

(56) References Cited

U.S. PATENT DOCUMENTS

| 8,707,795 | B2 | 4/2014 | Kittur et al. |
| 10,108,766 | B2 | 10/2018 | Druckman et al. |
| 10,346,969 | B1 * | 7/2019 | Raghu |
| 2008/0310476 | A1 | 12/2008 | Medgenberg et al. |
| 2016/0068278 | A1 | 3/2016 | Furfari et al. |

(Continued)

FOREIGN PATENT DOCUMENTS

GB 2550395 A 11/2017

OTHER PUBLICATIONS

Plekhov O., et al., Fatigue Crack Initiation and Growth in a 35CrMo4 Steel Investigated by Infrared Thermography, Fatigue and Fracture of Engineering Materials and Structures, Pergamon Press, vol. 28, No. 1-2, Jan. 7, 2005, Oxford, GB.

(Continued)

*Primary Examiner* — Syed A Roni
(74) *Attorney, Agent, or Firm* — LKGlobal | Lorenz & Kopf, LLP

(57) ABSTRACT

Exemplary embodiments of a system and method are provided for detecting cracks and crack propagation in aircraft structures subject to repetitive stress. A method for detecting onset or propagation of defects in a structure includes monitoring the structure with an infrared sensor to provide thermal data of the structure within a field of view of the infrared sensor. A processor is used to process the thermal data memory to extract features from the thermal data and utilize at least one machine learning model to detect onset or propagation of defects in the structure. A system includes an infrared sensor having a field of view of the structure and a processor coupled to the infrared sensor and a memory, which contains instructions that cause the processor to process thermal data from the infrared sensor to extract features from the thermal data and utilize at least one machine learning model to detect onset or propagation of the defects in the structure.

18 Claims, 5 Drawing Sheets

(56) References Cited

U.S. PATENT DOCUMENTS

| | | |
|---|---|---|
| 2017/0144778 A1 | 5/2017 | Brookhart et al. |
| 2018/0260720 A1 | 9/2018 | Wu et al. |
| 2019/0094124 A1 | 3/2019 | Ali et al. |
| 2020/0167640 A1* | 5/2020 | Sundareswara |

OTHER PUBLICATIONS

Sakagami T., et al, Fatigue crack identification using near-tip singular temperature field measured by lock-in thermography, Proceedings of SPIE, IEEE, vol. 4020, Jan. 1, 2000, US.

* cited by examiner

SYSTEM AND METHOD FOR DETECTING DEFECTS IN STRUCTURES SUBJECT TO REPETITIVE STRESS

TECHNICAL FIELD

The present disclosure generally relates to a system and method for detecting defects in structures subject to repetitive stress, and more particularly relates to a system and method for detecting crack initiation and crack propagation in aircraft structures subject to repetitive stress.

BACKGROUND

Structural components of an aircraft (e.g., fuselage, wings and landing gear) are subject to repetitive stress during the normal operations of take-offs, landings and maneuvers in various atmospheric conditions. Over time, or if stress forces exceed a threshold, defects (e.g., cracks) can form in aircraft structural components. Such defects may propagate over time to a point of a failure of the structural component. Consequently, aircraft undergo periodic examination by trained technicians to look for evidence of defects in structural components. Typically, such structural tests may include removal or opening of portions of the structural components to inspect whether defects have formed in the structure. Generally, it is rare for the technician to discover a defect at the moment the defect occurred, and therefore, after discovering a defect, the engineers must resort to using back-calculations and correlations to estimate the onset of the defect in the structural component. This process is time consuming and it requires highly skilled engineers and therefore is quite expensive.

Accordingly, it is desirable to provide advanced automated systems and methods for detecting the onset and/or propagation of defects (e.g., cracks) in aircraft and other structures subject to repetitive stress. Furthermore, other desirable features and characteristics of the present disclosure will become apparent from the subsequent detailed description and the appended claims, taken in conjunction with the accompanying drawings and the foregoing technical field and background.

SUMMARY

Exemplary embodiments of a system and method are provided for detecting cracks and crack propagation in aircraft structures subject to repetitive stress. In a first non-limiting embodiment, a method for detecting defects in a structure includes, but is not limited to, monitoring the structure with an infrared sensor to provide thermal data of the structure within a field of view of the infrared sensor during fatigue cycling. A processor is used to process the thermal data in memory to extract features from the thermal data and to utilize at least one machine learning model to detect defects in the structure.

In a second non-limiting embodiment, a system includes, but is not limited to, an infrared sensor having a field of view of the structure and a processor coupled to the infrared sensor. The processor is also coupled to a memory, which contains non-transitory instructions that when executed by the processor, cause the processor to process thermal data from the infrared sensor to extract features from the thermal data and to utilize at least one machine learning model to detect the defects in the structure.

BRIEF DESCRIPTION OF THE DRAWINGS

Advantages of the present disclosure will be readily appreciated, as the same become better understood by reference to the following detailed description when considered in connection with the accompanying drawings wherein.

DETAILED DESCRIPTION

Figure 1:
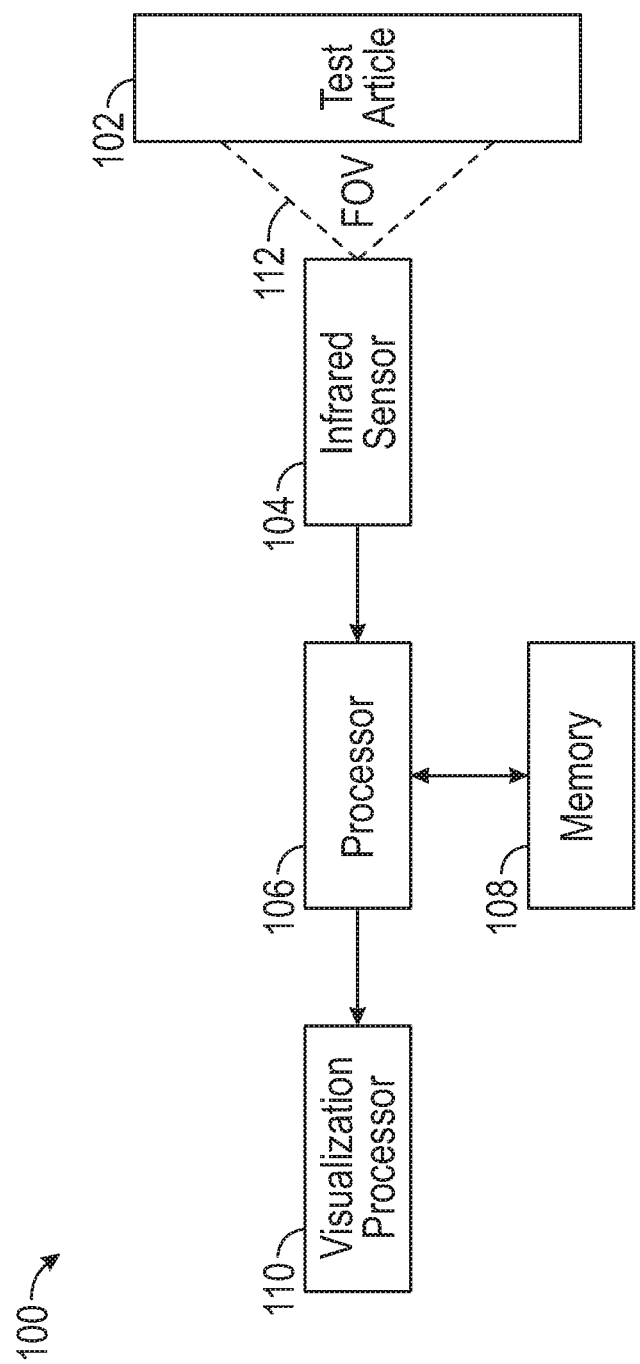
FIG. 1 is a block diagram of a system to detect defects in accordance with various embodiments.

The following detailed description is merely exemplary in nature and is not intended to limit the application and uses. Furthermore, there is no intention to be bound by any expressed or implied theory presented in the preceding technical field, background, brief summary or the following detailed description. As used herein, the term module refers to any hardware, software, firmware, electronic control component, processing logic, and/or processor device, individually or in any combination, including without limitation: application specific integrated circuit (ASIC), an electronic circuit, a processor (shared, dedicated, or group) and memory that executes one or more software or firmware programs, a combinational logic circuit, and/or other suitable components that provide the described functionality.

Embodiments of the present disclosure may be described herein in terms of functional and/or logical block components and various processing steps. It should be appreciated that such block components may be realized by any number of hardware, software, and/or firmware components configured to perform the specified functions. For example, an embodiment of the present disclosure may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments of the present disclosure may be practiced in conjunction with any number of systems, and that the systems described herein are merely exemplary embodiments of the present disclosure.

For the sake of brevity, conventional techniques related to signal processing, data transmission, signaling, control, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment of the present disclosure.

It is further noted that the systems and methods may be implemented on various types of data processor environments (e.g., on one or more data processors) which execute instructions (e.g., software instructions) to perform operations disclosed herein. Non-limiting examples include implementation on a single general purpose computer or workstation, or on a networked system, or in a client-server configuration, or in an application service provider configuration. For example, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to carry out the methods and systems described herein. For example, a computer can be programmed with instructions to perform the various steps of the flowcharts described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., memory, RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The systems and methods may be provided on many different types of computer-readable storage media including computer storage mechanisms (e.g., non-transitory media, such as CD-ROM, diskette, RAM, flash memory, computer's hard drive, etc.) that contain instructions (e.g., software) for use in execution by a processor to perform the methods' operations and implement the systems described herein.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

Various embodiments disclosed herein describe a system and method for monitoring a structural component of an aircraft to determine the onset of a defect (i.e., crack) or progression of a defect (i.e., crack propagation) caused by the structural component being subjective to periodic or repetitive stress. Although the system and method disclosed herein is described in connection with monitoring aircraft components, it should be appreciated that the system and method of the present disclosure may be utilized in other air vehicles, land vehicles, surface water vehicles, submersible water vehicles, space vehicles, or other structures without departing from the scope of the present disclosure.

In exemplary embodiments, the system and method herein utilizes continuous infrared monitoring of a structural component to create a thermal map that is examined over time using infrared thermography and machine learning to detect the onset and/or propagation of cracks or other defects. As used herein, the term "machine learning" means the use of algorithms or statistical models expressed in computer instructions to effectively perform an automated task without using explicit instructions to achieve the task. In accordance with exemplary embodiments disclosed herein, the task includes the automated detection of meaningful patterns in data to detect the onset and/or propagation of defects in structural components subject to repetitive stress. As will be appreciated, there are generally three types of machine learning: unsupervised learning (e.g., clustering), supervised learning (e.g., neural networks or other systems that predict an output variable from a given set of predictor variables) and reinforcement learning (e.g., self-training by continuous trial and error). Common machine learning techniques include linear regression, logistic regression, decision tree, support vector machine (SVM), k-nearest neighbors (kNN), K-Means and dimensionally reduced algorithms to name a few.

Referring now to FIG. 1, a block diagram of a defect detection system 100 is illustrated monitoring a structure 102 under test. In exemplary embodiments, the structure 102 may be a component of an aircraft, including, but not limited to, a section (within a field of view (FOV) 112 of the infrared sensor 104) of fuselage, passenger door or wing or landing gear. The defect detection system 100 includes an infrared sensor 104, a processor 106, a memory 108 that is used to store data received from the infrared sensor 104 together with instructions that cause the processor 106 to utilize machine learning to process data from the infrared sensor 104 to determine the onset and/or propagation of defects (e.g., cracks) in the structural component 102. When a defect is detected, the detection system 100 produces a thermal map that can be displayed via a visualization processor 110 to provide a technician with a visual indication of the location and/or propagation path of the defect. In some embodiments, the visualization processor 110 may be a laptop computer, a tablet computer or other personal computing device (e.g., cell phone) having a display to present a thermal map to a user. In non-limiting embodiments, the detection system 100 utilizes two machine learning techniques to detect and track the propagation of defects in the structural component 102. A first unsupervised machine learning technique (i.e., clustering) is utilized to create models by identifying clusters of high temperature data points provided in the data from the infrared sensor 104. A change in the number of clusters or a change in the position of the centroid of a cluster indicates the presence of crack or crack growth in the structural component 102. A second supervised machine learning technique (i.e., neural network) is utilized to create a histogram of oriented gradients (HOG) which is used as a feature descriptor door to characterize the temperature gradient at the point or tip of a defect. The neural network classifier is trained with images from the infrared sensor 104 representing the thermal distribution at cracked tips generated from various structural fatigue tests applied to the structure under test 102. Operationally, the infrared sensor 104 reads at a specific frequency rate a temperature map of a portion of the structural component 102 within its field of view 112. Continuous cycles of thermal data are provided to the processor 106 at the frequency rate selected for operation by the system designer or an operating technician.

In exemplary embodiments, the memory 108 contains instructions that may include one or more separate programs, each of which comprises a listing of executable instructions for implementing machine learning functions. The instructions, when executed by the processor 106, receive and process signals from the infrared sensor 104, perform logic, calculations, methods and/or algorithms for automatically utilizing both unsupervised and supervised machine learning to detect the onset and/or propagation of cracks or other defects in the structure under test 102. Although only one processor 106 is shown in FIG. 1, embodiments of the detection system 100 may include any number of processors that communicate over any suitable communication medium or a combination of communication media and that cooperate to process the infrared sensor signals as will be described in more detail below in connection with FIG. 4 and FIG. 5.

Figure 2B:
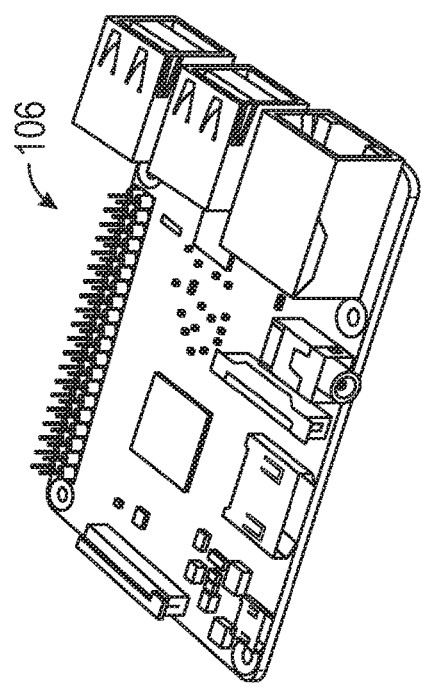
FIGS. 2A-2D are illustrations of components making up an exemplary embodiment of the system of FIG. 1 in accordance with various embodiments.
Figure 2C:
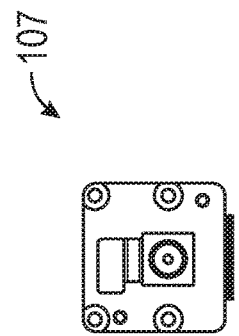
Figure 2D:
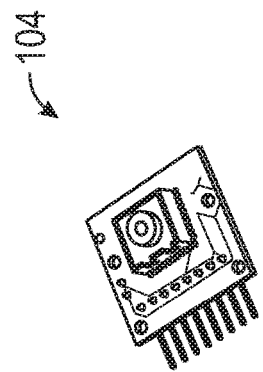
Figure 2A:
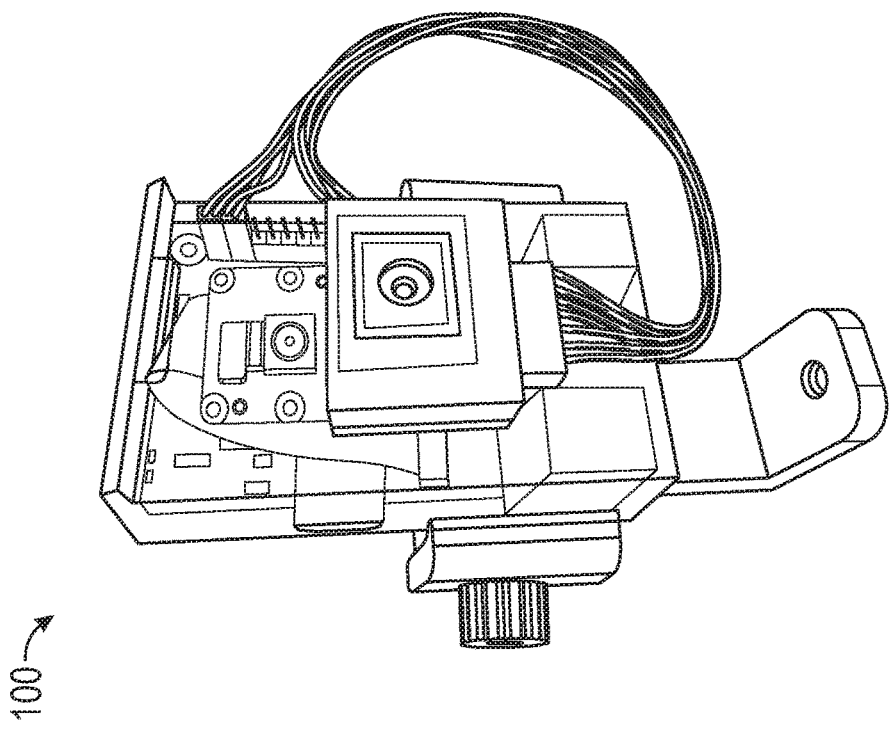

Referring now to FIGS. 2A-2D, and with continued reference to FIG. 1, detection system 100 includes a processor module 106 that may be realized in exemplary embodiments as a RASPBERRY PI board shown in FIG. 2B. The infrared sensor 104 may be realized as a FLIR LEPTON 3 infrared thermal sensor (FIG. 2D) that may be coupled to the general-purpose input-output (GPIO) interface of the RASPBERRY PI board 106. Additionally, in some embodiments a visual-spectrum camera 107 may be coupled to the processor 106 and may be realized in exemplary embodiments as a RASPBERRY PI camera (FIG. 2C). The visual-spectrum camera 107 may be used to provide a photographic confirmation (see FIG. 3C) of a crack onset or propagation of a crack. Utilizing these components an exemplary embodiment of the detection system 100 may be realized using open source software such as, for example, Python 3.6 programming language, Python scientific modules (e.g., NumPy, SciPy and Matplotlib), Python machine learning modules (i.e., Scikit-learn and Scikit-image) in the Python and Pylepton module. Those skilled in the art will appreciate how to realize a detection system 100 utilizing the above modules and software.

Figure 3A:
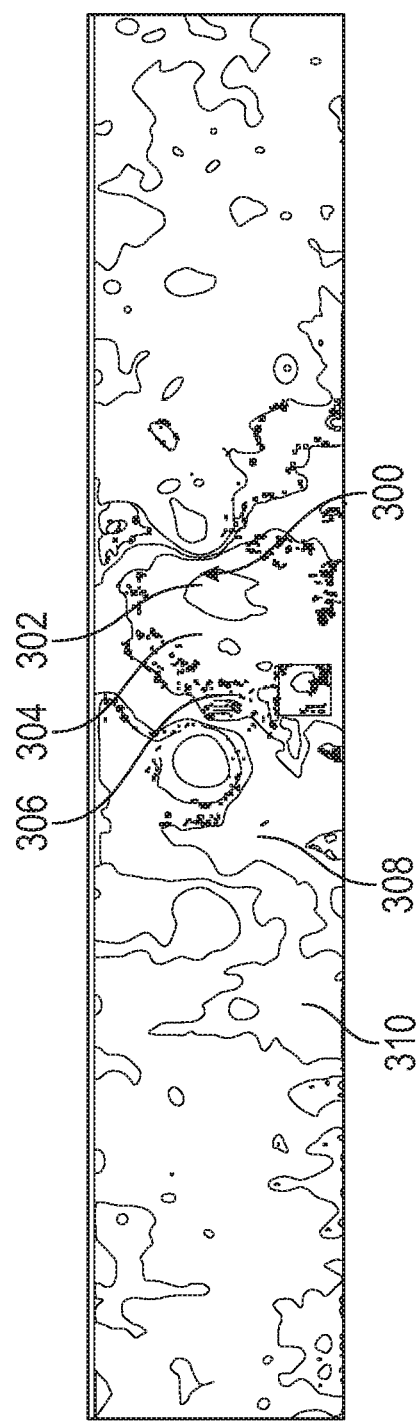
FIG. 3A is an illustrations of a thermal map indicating the onset of the defect in a structural component under test in accordance with various embodiments.
Figure 3B:
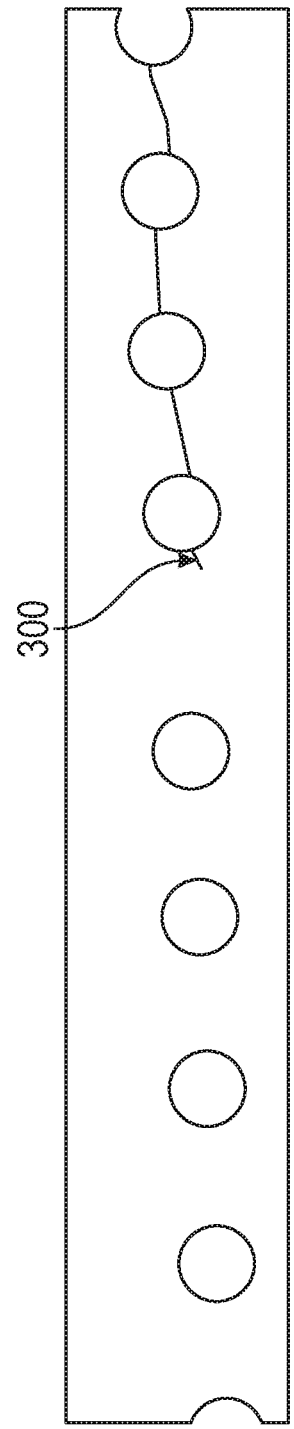
FIG. 3B is an illustration of photographic evidence of the presence of the crack.

As will be explained in more detail below in connection with FIG. 4 and FIG. 5 upon detection of a crack or defect, or the detection of crack propagation, the detection system 100 generates a flag or alert to notify an operating technician of the detection, and one or more thermal map visualizations are prepared for display to the technician to illustrate the location and/or propagation path of the defect. An exemplary illustration (as a line drawing) of these thermal map(s) is shown in FIG. 3A. In FIG. 3A, the X-Y axis denotes position and contour plots in the color map (the intensity areas 302-310) represents temperatures at a particular instant in time from the cycles of data taken by the infrared sensor 104. As can be seen, the location of a crack tip 300 can be identified in the image to direct and assist the technician to locate the defect. Additionally, photographic confirmation (FIG. 3B) can be provided by visual-spectrum camera (107 in FIG. 2) in some embodiments.

Figure 4:
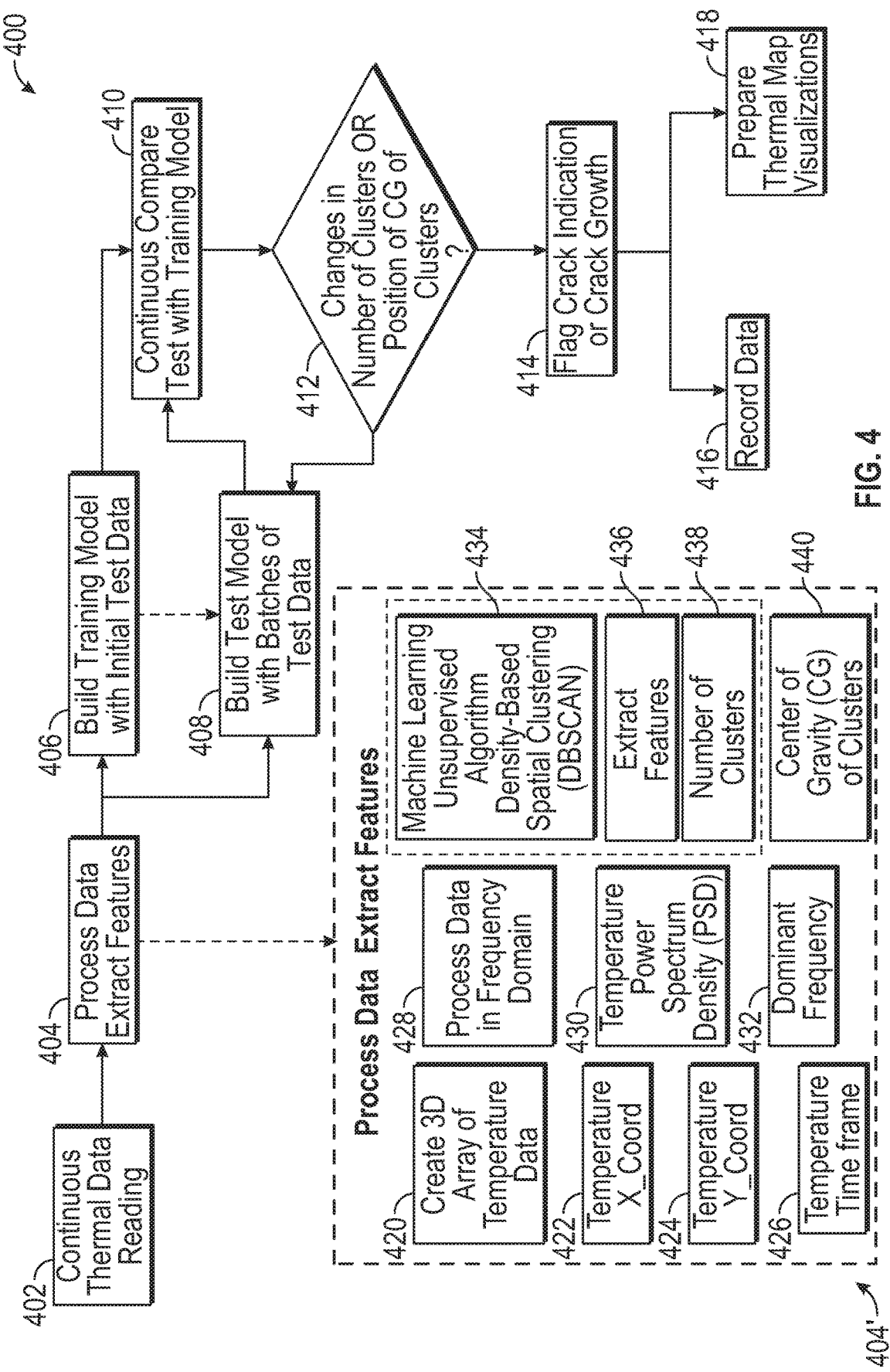
FIG. 4 is a flow diagram illustrating a method for unsupervised machine learning in accordance with various embodiments.

Referring now to FIG. 4, and with continued reference to FIG. 1, a flow diagram for a method 400 is illustrated to implement an unsupervised machine learning technique that may be used in exemplary embodiments as a first machine learning technique of two machine learning techniques employed in any particular realization of the present disclosure. The method 400 utilizes density-based spatial clustering algorithms (DBSCAN) to identify high density temperature data points from samples provided by the infrared sensor 104 during each cycle of measurement. The method 400 expands and clusters these high temperature data points to provide a number of clusters each associated with the data forming the clusters as provided by the infrared sensor 104. A change in the number of clusters or a change in the position of a centroid of a cluster from cycle to cycle of measurement indicates the presence of a defect or growth of a defect within the structure under test 102. In exemplary embodiments, the method 400 of FIG. 4 may be realized by the Python Scikit-Learn software.

The method 400 begins in block 402 where continuous thermal data reading is performed by the infrared sensor 104 of the structure 102 under test within the field of view 112. In block 404, the processor 106 processes the data received from the infrared sensor 104 to extract features that comprise identity temperature data points and uses that information to form clusters and then to analyze those clusters. Initial cycles of data provided by the infrared sensor 104 is used to build a training model in block 406. Subsequent cycles of data provided by the infrared sensor 104 are used to build the test model in block 408. With each new cycle of test data, the training model is compared with the test data in block 410. Block 412 determines whether there have been changes in the number of clusters or a change in the position of a centroid of one or more of the clusters and if not, the routine returns to block 408 where a next cycle of test data is received, processed and sent to block 410 for comparison. Conversely, if the determination of block 412 is that there has been a change in the number of clusters or a centroid of one or more clusters, an indication is provided that a defect has been identified (or defect has expanded since the last measurement cycle) in block 414. In block 416, the data is recorded for later analysis and a thermal map visualization is prepared in block 418 for presentation to the technician to assist in the location of the defect in the structure under test 102.

The processor 106 performs a variety of functions in block 404 where data from the infrared sensor 104 is processed and temperature features are extracted. As illustrated in block 404', these functions include the creation of a three-dimensional (3D) array of temperature data in block 420. In some embodiments, the 3D array of temperature data includes the temperature data point X axis coordinate (block 422), the temperature data point Y axis coordinate (block 424) (each within the FOV 112 of the infrared sensor 104) and the temperature timeframe (i.e., the time of the cycle of measurement) in block 426. Additionally, the processor 106 processes the received temperature data in the frequency domain in block 428. Temperature power spectrum density (PSD) is prepared in block 430 and the dominant frequency is determined in block 432. Also, the unsupervised machine learning function is performed by the processor 106 in block 434 where temperature features are extracted in block 436 and clusters identified in block 438. Finally, a center of gravity (CG) of each cluster is identified for later comparison in block 410 and decision by block 412.

Figure 5:
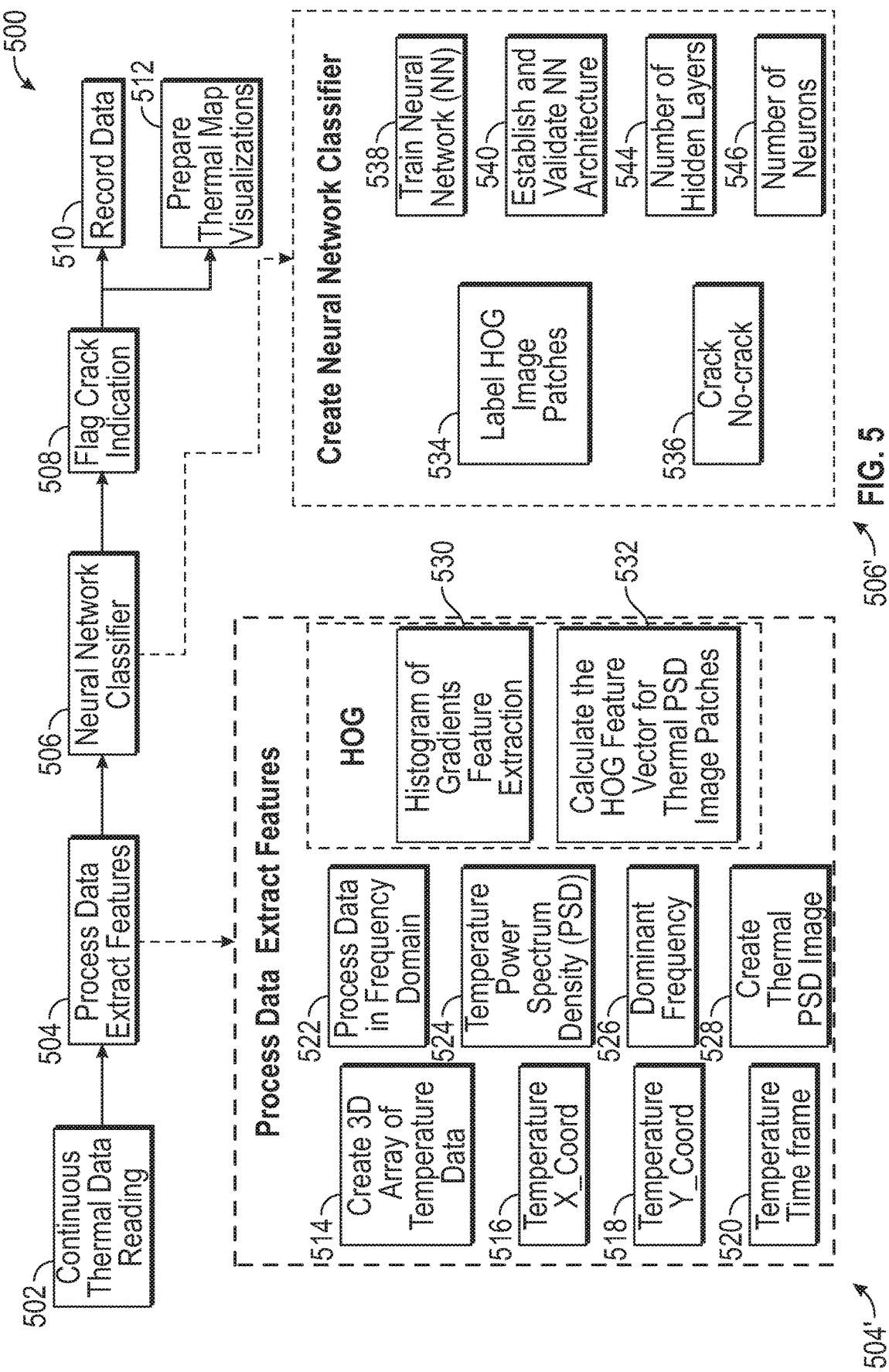
FIG. 5 is a flow diagram illustrating a method for neural network machine learning in accordance with various embodiments.

Referring now to FIG. 5, and with continued reference to FIG. 1, a flow diagram for a method 500 is illustrated to implement a supervised machine learning technique that may be used in exemplary embodiments as a second machine learning technique of the two machine learning techniques employed in any particular realization of the present disclosure. The method 500 utilizes feature extraction from the data provided by the infrared sensor 104 that comprises a representation of an image (or an image patch) that operates to simplify the image by extracting useful information and discarding unnecessary information. Additionally, a histogram of gradients (HOG) are used as a feature as the magnitude of gradients becomes large around regions of abrupt intensity changes in the thermal data (i.e., the formation of a defect). The features produced by the HOG are utilized in a neural network image classification process to identify the location and propagation paths of cracks or other defects in the structure under test 102. In exemplary embodiments, the method 500 of FIG. 5 may be realized by the Python Scikit-Learn and Python Scikit-Image software.

The method 500 begins in block 502 where continuous thermal data reading is performed by the infrared sensor 104 of the structure under test 102 within the field of view 112. In block 504, the processor 106 processes the data received from the infrared sensor 104 to extract features by extracting useful information and discarding unnecessary information and produces the HOG vectors. This information is fed into the neural network classifier in block 506 which determines whether or not a defect can be identified using the neural network classifier. If so, the routine flags the crack indication in block 508 to alert the technician and the data is recorded in block 510 and a thermal map visualization is prepared in block 512 to provide an indication to the technician for the location of the defect in the structure under test 102.

The processor 106 performs a variety of functions in block 504 where data from the infrared sensor 104 is processed and temperature features are extracted. As illustrated in block 504', these functions include the creation of a three-dimensional (3D) array of temperature data in block 514. In some embodiments, the 3D array of temperature data includes the temperature data point X axis coordinate (block 516), the temperature data point Y axis coordinate (block 518) (each within the FOV 112 of the infrared sensor 104) and the temperature timeframe (i.e., the time of the cycle of measurement) in block 520. Additionally, the processor 106 processes the received temperature data in the frequency domain in block 522. Temperature power spectrum density (PSD) is prepared in block 524 and the dominant frequency is determined in block 526. Additionally, a thermal power spectrum density image is produced in block 528. The supervised machine learning process using the HOG technique is performed in block 530. The supervised machine learning process 530 is the second of two machine learning techniques utilized by the present disclosure to locate the presence of defects in the structure under test. The HOG feature vector for the thermal PSD image patches is prepared in block 532 which will be later used in the neural network classifier 506.

The neural network classifier 506 also performs a variety of functions as indicated at block 506'. First the HOG image patches provided by the processor 504 are labeled in block 534 and in block 536, a crack/no-crack determination is made using the neural network classifier. The neural network is trained in block 538 the neural network architectures establish and validated in block 540 which includes identifying a number of hidden layers (block 544) and a number of neurons (block 546) of the neural network.

The various embodiments disclosed herein facilitate the automated identification of crack onset and/or crack propagation in a variety of aircraft structures that alleviates the manual, time-consuming and expensive examination processes of the past. Accordingly, the present disclosure offers an improvement in defect identification of structures under repeated stress an automated computer systems designed to identify such defects.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. A method for detecting defects in a structure subject to fatigue cycling, the method comprising:
    monitoring the structure with an infrared sensor to provide thermal data of the structure within a field of view of the infrared sensor; and
    processing the thermal data in a processor, the processor configured to execute instructions stored in a memory to extract features from the thermal data and to utilize at least one machine learning model to detect onset or propagation of defects in the structure;
    wherein processing the thermal data further comprises utilizing a first and second machine learning model to detect onset or propagation of defects in the structure.

2. The method of claim 1, wherein processing the thermal data further comprises utilizing an unsupervised machine learning model to detect onset or propagation of defects in the structure.

3. The method of claim 1, wherein processing the thermal data further comprises utilizing a neural network machine learning model to detect onset or propagation of defects in the structure.

4. The method of claim 1, wherein monitoring the structure comprises continuously monitoring, in cycles, the structure with the infrared sensor to provide the thermal data of the structure within the field of view of the infrared sensor.

5. The method of claim 4, wherein processing the thermal data further comprises creating a training model for the machine learning model utilizing one or more initial cycles of the thermal data from the infrared sensor.

6. The method of claim 5, wherein processing the thermal data further comprises training a test model with subsequent cycles of the thermal data from the infrared sensor.

7. The method of claim 6, wherein processing the thermal data further comprises continuously comparing, in cycles, the training model with the test model to detect onset or propagation of defects in the structure.

8. The method of claim 1, further comprising the processor providing an indication that the machine learning model has detected onset or propagation of a defect in the structure.

9. The method of claim 1, further comprising displaying thermal visualizations of the defect in the structure via a visualization processor.

10. An infrared thermography system for detecting defects in a structure subject to fatigue cycling, the system comprising:
    an infrared sensor having a field of view of the structure; and
    a processor coupled to the infrared sensor and to a memory, the memory containing non-transitory instructions that, when executed by the processor, cause the processor to process thermal data from the infrared sensor to extract features from the thermal data and utilize at least one machine learning model to detect onset or propagation of defects in the structure;
    wherein the instructions executed by the processor cause the processor to process the thermal data utilizing a first and second machine learning model to detect onset or propagation of defects in the structure.

11. The system of claim 10, wherein the instructions executed by the processor cause the processor to process the thermal data utilizing a first unsupervised machine learning model to detect onset or propagation of defects in the structure.

12. The system of claim 10, wherein the instructions executed by the processor cause the processor to process the thermal data utilizing a second neural network machine learning model to detect onset or propagation of defects in the structure.

13. The system of claim 10, wherein the infrared sensor monitors the structure within the field of view by continuously monitoring, in cycles, the structure to provide the thermal data of the structure within the field of view of the infrared sensor to the processor.

14. The system of claim 13, wherein the instructions executed by the processor cause the processor to process the thermal data to create a training model for the machine learning model utilizing one or more initial cycles of the thermal data from the infrared sensor.

15. The system of claim 14, wherein the instructions executed by the processor cause the processor to process the thermal data to train a test model with subsequent cycles of the thermal data from the infrared sensor.

16. The system of claim 15, wherein the instructions executed by the processor cause the processor to process the thermal data further comprises continuously comparing, in cycles, the training model with the test model to detect onset or propagation of defects in the structure.

17. The system of claim 10, wherein the processor provides an indication that the machine learning model has detected onset or propagation of a defect in the structure.

18. The system of claim 10, further comprising a visualization processor for displaying thermal visualizations of the defect in the structure.

* * * * *